US012802946B2

(12) United States Patent
Pan et al.

(10) Patent No.: US 12,802,946 B2
(45) Date of Patent: Nov. 17, 2026

(54) ADJUSTABLE GROUNDING AND BIASING AREA

(71) Applicant: Applied Materials, Inc., Santa Clara, CA (US)

(72) Inventors: Junjie Pan, Santa Clara, CA (US); Xiangjin Xie, Fremont, CA (US); Kevin Kashefi, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 9 days.

(21) Appl. No.: 18/820,040

(22) Filed: Aug. 29, 2024

(65) Prior Publication Data

US 2026/0066240 A1 Mar. 5, 2026

(51) Int. Cl.
*H01J 37/32* (2006.01)

(52) U.S. Cl.
CPC .. *H01J 37/32568* (2013.01); *H01J 37/32559* (2013.01); *H01J 2237/332* (2013.01)

(58) Field of Classification Search
CPC ........... H01J 37/32568; H01J 37/32559; H01J 2237/332
See application file for complete search history.

(56) References Cited

U.S. PATENT DOCUMENTS 5,534,751 A 7/1996 Lenz et al.
6,287,986 B1 9/2001 Mihara
2009/0308739 A1* 12/2009 Riker .................. H01J 37/3447 204/298.11
2010/0252417 A1 10/2010 Allen et al.
2019/0271070 A1 9/2019 Abraham et al.

FOREIGN PATENT DOCUMENTS

JP H0945667 A 2/1997
TW 202523884 A * 6/2025 ............. C23C 14/35

OTHER PUBLICATIONS

International Search Report and Written Opinion for Application No. PCT/US2025/042198 mailed Dec. 19, 2025.

* cited by examiner

*Primary Examiner* — Jimmy T Vu
(74) *Attorney, Agent, or Firm* — Patterson + Sheridan, LLP

(57) ABSTRACT

Embodiments of the disclosure describe an apparatus that includes a processing chamber having a grounded chamber shield that at least partially defines a processing region. An electrode is disposed within the processing region of the processing chamber. The electrode includes apertures extending through the electrode and the electrode is disposed between a sputtering target and a substrate. A voltage source is configured to apply a positive DC bias to the electrode. A grounded electrode shield is disposed within the processing region and extends a distance from the electrode. The distance is adjustable to vary a ratio of a surface area of the electrode to a surface area of the grounded electrode shield.

20 Claims, 12 Drawing Sheets

403

ADJUSTABLE GROUNDING AND BIASING AREA

BACKGROUND

Field

Embodiments of the present disclosure generally relate to physical vapor deposition (PVD) processing chambers. More specifically, embodiments of the present disclosure relate to PVD process chamber components.

Description of the Related Art

Physical vapor deposition (PVD) is one of many substrate processing techniques utilized in the field of semiconductor device fabrication. One of the key challenges in device fabrication is the need to deposit thin films of various materials with uniformity and precision. PVD is a common technique used for depositing thin films of various metals and metal alloys of a sputtering target onto a substrate. However, when using PVD for depositing material on bottoms and sidewalls of high aspect ratio features such as trenches or vias, off-angle ion approach at the periphery/edges of the substrate results in sidewall asymmetry which is undesirable.

Accordingly, there is a need in the art for a method and apparatus that solves the problems described above.

SUMMARY

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

Embodiments of the disclosure describe an apparatus that includes a processing chamber having a grounded chamber shield that at least partially defines a processing region. An electrode is disposed within the processing region of the processing chamber. The electrode includes apertures extending through the electrode and the electrode is disposed between a sputtering target and a substrate. A voltage source is configured to apply a positive DC bias to the electrode. A grounded electrode shield is disposed within the processing region and extends a distance from the electrode. The distance is adjustable to vary a ratio of a surface area of the electrode to a surface area of the grounded electrode shield.

Embodiments of the disclosure describe method that includes disposing an electrode within a processing chamber between a sputtering target and a substrate. A positive DC bias is applied to the electrode. A first electrical conductor is grounded. The first electrical conductor is disposed between the electrode and a second electrical conductor. A negative DC bias is applied to the second electrical conductor. The second electrical conductor is disposed between the first electrical conductor and the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
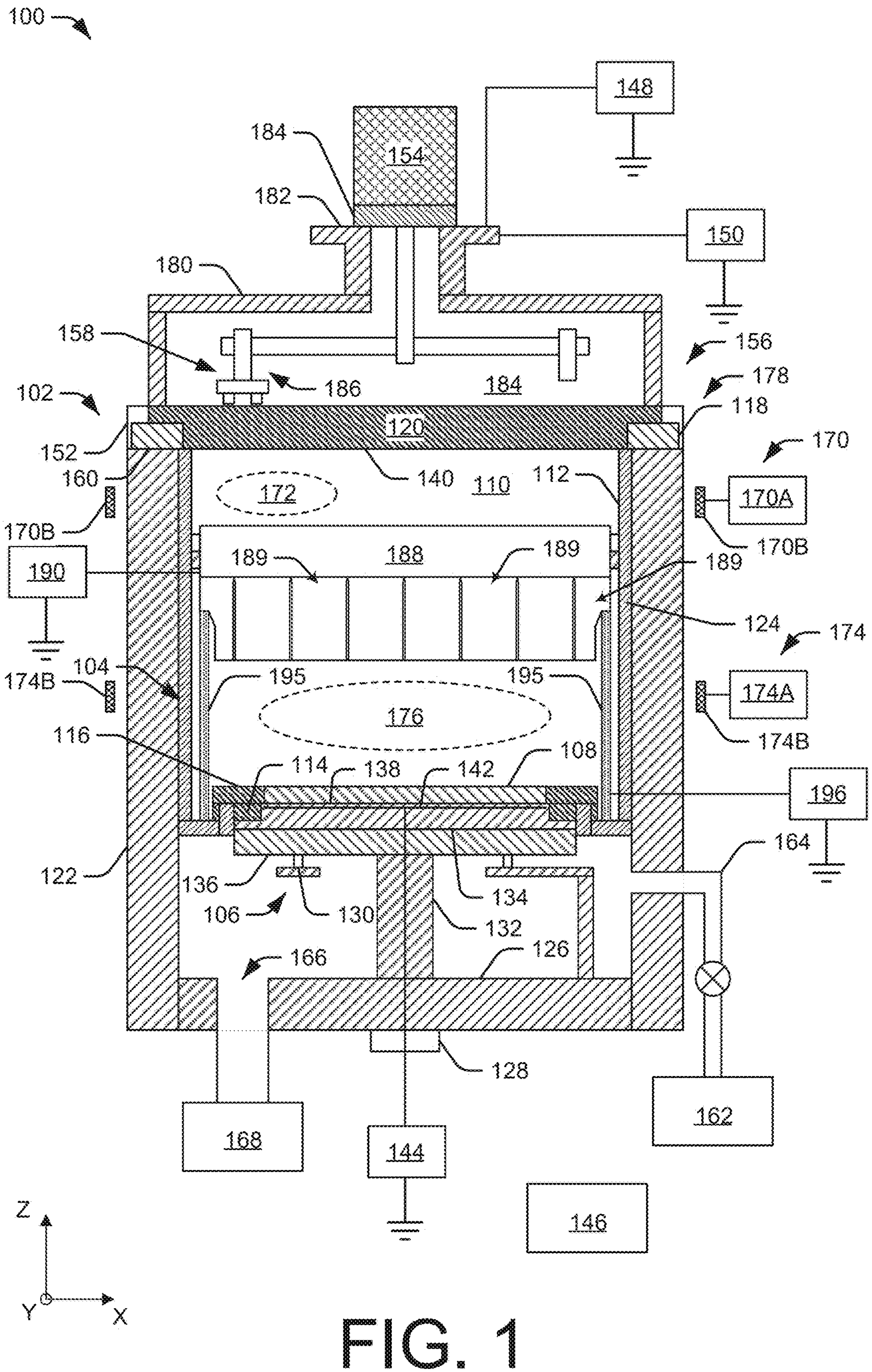
FIG. 1 illustrates a cross-sectional view of a processing chamber, in accordance with certain embodiments of the present disclosure.

Embodiments of the present disclosure generally relate to physical vapor deposition (PVD) processing chambers. More specifically, embodiments of the present disclosure relate to adjustable surface areas of biasable chamber elements (e.g., electrodes) and grounded electrode shields disposed in a processing region of a processing chamber. In some embodiments, a biasable chamber element can be biased cathodically or anodically during a PVD process. While not intending to limit the scope of the disclosure provided herein, for simplicity of discussion purposes a biasable chamber element will be often be referred to herein as an electrode. Although it is typical for the biasable chamber elements to be biased positively relative to the surface of the PVD target and/or ground during processing, it is to be appreciated that, in some embodiments, the biasable chamber elements may be biased negatively relative to the surface of the PVD target and/or ground during processing. The electrode is also referred to as a biasable flux optimizer (BFO) and/or a collimator. The electrode is physically disposed between a sputtering target and a substrate. The sputtering target includes material to be deposited on bottoms and sidewalls of high aspect ratio features of the substrate such as trenches and vias. In one or more embodiments, the substrate is disposed within a grounded electrode shield which is disposed within a grounded chamber shield. The grounded electrode shield extends a distance between a grounding element and the electrode.

Material sputtered from the PVD target include neutrals and positively charged ions. The electrode includes a plurality of apertures which extend through the electrode. The apertures are configured to allow the neutrals moving from the target towards the substrate in directions that are more normal to the surface of the substrate to pass through the electrode and the apertures are configured to prevent neutrals that are moving in directions that are more parallel to the substrate surface from reaching the substrate. In some embodiments, a positively charged DC bias is applied to the electrode (e.g., relative to the grounded electrode shield) in order to filter the positively charged ions in directions that are more normal to the surface of the substrate, due to the electrode being physically disposed between the target and substrate.

However, it has been found that if a ratio of a surface area of the electrode to a surface area of the grounded electrode shield is too large (e.g., greater than a threshold ratio), then the positively charged ions that arrive at a periphery/edge of the substrate will tend to arrive at an off-angle (e.g., an angle closer to parallel to the surface of the substrate instead of closer to normal to the surface of the substrate). The off-angle arrival of the positively charged ions results in sidewall asymmetry within the high aspect ratio features formed on the substrate which is undesirable. In order to decrease the ratio of the surface area of the electrode to the surface area of the grounded electrode shield, the distance that the grounded electrode shield extends between the grounding element and the electrode is selected to improve the deposited film properties, which can include step-coverage, bottom coverage, deposition symmetry across the substrate, and deposition uniformity.

In some embodiments, the distance is increased by adding a spacer (e.g., a grounded spacer, a floating spacer, or a biased spacer) between an electrically conductive portion of the grounded electrode shield and the electrode. Increasing the distance increases the surface area of the grounded electrode shield which reduces the surface area ratio. With an increasingly reduced surface area ratio, the positively charged ions that arrive at the periphery/edge of the substrate tend to arrive at more of normal angle relative to the surface of the substrate than the off-angle direction which improves the sidewall symmetry achieved for the PVD deposition in high aspect ratio features.

Processing Chamber Examples

FIG. 1 illustrates a cross-sectional view of a processing chamber 100. The processing chamber 100 includes an upper process assembly 102, a process kit 104, and a pedestal assembly 106, which are all configured to process a substrate 108 disposed in a processing region 110. The process kit 104 includes a grounded chamber shield 112, a deposition ring 114, a cover ring 116, and an isolator ring assembly 118. In the version shown, the processing chamber 100 comprises a sputtering chamber, also called a physical vapor deposition (PVD) chamber, capable of depositing a single or multi-compositional material from a sputtering target 120 on the substrate 108. The processing chamber 100 may also be used to deposit aluminum (Al), copper (Cu), nickel (Ni), platinum (Pt), hafnium (Hf), silver (Ag), chrome (Cr), gold (Au), molybdenum (Mo), silicon (Si), ruthenium (Ru), tantalum (Ta), tantalum nitride (TaN), tantalum carbide (TaC), titanium nitride (TiN), tungsten (W), tungsten nitride (WN), lanthanum (La), alumina ($AlO_x$), lanthanum oxides ($LaO_x$), nickel platinum alloys (NiPt), and titanium (Ti), and or combination thereof.

The processing chamber 100 includes a chamber body 122 having sidewalls 124, a bottom wall 126, and the upper process assembly 102 that enclose the processing region 110 or plasma zone. The chamber body 122 is typically fabricated from welded plates of stainless steel or a unitary block of aluminum. In some embodiments, the sidewalls comprise aluminum and the bottom portion of the chamber includes one or more walls that are formed from a stainless steel plate. The sidewalls 124 generally contain a slit valve (not shown) to provide for entry and egress of a substrate 108 from the processing chamber 100. Components in the upper process assembly 102 of the processing chamber 100 in cooperation with the grounded chamber shield 112, pedestal assembly 106 and cover ring 116 confine the plasma formed in the processing region 110 to the region above the substrate 108.

The pedestal assembly 106 is supported from the bottom wall 126 of the processing chamber 100. The pedestal assembly 106 supports the deposition ring 114 along with the substrate 108 during processing. The pedestal assembly 106 is coupled to the bottom wall 126 of the processing chamber 100 by a lift mechanism 128, which is configured to move the pedestal assembly 106 between an upper processing position and lower transfer position. Additionally, in the lower transfer position, lift pins 130 are moved through the pedestal assembly 106 to position the substrate a distance from the pedestal assembly 106 to facilitate the exchange of the substrate with a substrate transfer mechanism disposed exterior to the processing chamber 100, such as a single blade robot (not shown). A bellows 132 is typically disposed between the pedestal assembly 106 and the bottom wall 126 to isolate the processing region 110 from the interior of the pedestal assembly 106 and the exterior of the chamber.

The pedestal assembly 106 generally includes a substrate support 134 sealingly coupled to a platform housing 136. The platform housing 136 is typically fabricated from a metallic material such as stainless steel or aluminum. A cooling plate (not shown) is generally disposed within the platform housing 136 enabling thermal regulation of the substrate support 134.

The substrate support 134 may be comprised of aluminum or ceramic. The substrate support 134 has a substrate receiving surface 138 that receives and supports the substrate 108 during processing, the substrate receiving surface 138 being substantially parallel to a sputtering surface 140 of the sputtering target 120. The substrate support 134 may be an electrostatic chuck, a ceramic body, a heater, or a combination thereof. In some embodiments, the substrate support 134 is an electrostatic chuck that includes a dielectric body having an electrode 142, embedded therein. The dielectric body is typically fabricated from a high thermal conductivity dielectric material such as pyrolytic boron nitride, aluminum nitride, silicon nitride, alumina or an equivalent material. Other aspects of the pedestal assembly 106 and substrate support 134 are further described below. In one embodiment, the electrode 142 is configured so that when a DC voltage is applied to the electrode 142, a substrate 108 disposed on the substrate receiving surface 138 will be electrostatically chucked thereto to improve the heat transfer between the substrate 108 and the substrate support 134. In some embodiments, a pulsed-voltage (PV) waveform source 144 is electrically coupled to the electrode 142, and is configured to generate a pulsed-voltage signal that comprises a PV waveform so that a pulsed voltage signal can be provided to the substrate 108 during processing to affect and control the plasma interaction with the surface of the substrate 108.

A program (or computer instructions) readable by a system controller 146 determines which tasks are performable on a substrate. In some embodiments, the system controller 146 includes a computing device having one or more processors, memory, and storage. The one or more processors can include central processing units, graphics processing units, accelerators, etc. The memory includes main memory for storing instructions for the one or more processors to execute or data for the one or more processors to operate on. For example, the memory includes random access memory (RAM). The storage includes mass storage for data or instructions. As an example and not by way of limitation, the storage may include a removable disk drive, flash memory, an optical disc, a magneto-optical disc, magnetic tape, or a Universal Serial Bus drive or two or more of these. The storage may include removable or fixed media and may be internal or external to the computing device. The storage may include any suitable form of non-volatile, solid-state memory, or read-only memory. The system controller 146 includes a non-transitory computer readable medium or media. The non-transitory computer readable medium or media may include one or more semiconductor-based or other integrated circuits (ICs) (such, as for example, field-programmable gate arrays or application-specific ICs), hard disk drives, hybrid hard drives, optical discs, optical disc drives, magneto-optical discs, magneto-optical drives, solid-state drives, RAM drives, any other suitable non-transitory computer readable storage medium/media, or any suitable combination. The non-transitory computer readable medium or media may be volatile, non-volatile, or a combination of volatile and non-volatile.

Preferably, the program is software readable by the system controller 146 that includes code to perform tasks relating to monitoring, execution, and control of the movement and various process recipe tasks and recipe steps being performed in the processing chamber 100. For example, the program can comprise program code that includes a substrate positioning instruction set to operate the pedestal assembly 106; a gas flow control instruction set to operate gas flow control valves to set a flow of sputtering gas to the processing chamber 100; a gas pressure control instruction set to operate a throttle valve or gate valve to maintain a pressure in the processing chamber 100; a temperature control instruction set to control a temperature control system (not shown) in the pedestal assembly 106 or sidewalls 124 to set temperatures of the substrate 108 or sidewalls 124, respectively; and a process monitoring instruction set to monitor the process in the processing chamber 100.

The upper process assembly 102 may also comprise an RF source 148, a direct current (DC) source 150, an adaptor 152, a motor 154, and a lid assembly 156. The lid assembly 156 generally comprises the sputtering target 120, and a magnetron system 158. The upper process assembly 102 is supported by the sidewalls 124 when in a closed position, as shown in FIG. 1. A ceramic target isolator 160 is disposed between the isolator ring assembly 118, the sputtering target 120, and the adaptor 152 of the lid assembly 156 to prevent vacuum leakage there between. The adaptor 152 is sealably coupled to the sidewalls 124, and is configured to help with the removal of the upper process assembly 102 and isolator ring assembly 118.

When in the processing position, the sputtering target 120 is disposed adjacent to the adaptor 152, and is exposed to the processing region 110 of the processing chamber 100. The sputtering target 120 contains material that is deposited on the substrate 108 during a PVD, or sputtering, process. The isolator ring assembly 118 is disposed between the sputtering target 120 and the grounded chamber shield 112 and the chamber body 122 electrically isolating the sputtering target 120 from the grounded chamber shield 112 and chamber body 122.

During processing, the sputtering target 120 is biased relative to a grounded region of the processing chamber 100 (e.g., the chamber body 122 and the adaptor 152) by a power source disposed in the RF source 148 and/or the direct current (DC) source 150. It is believed that by delivering RF energy and/or DC power to the sputtering target 120 during a high pressure PVD process, significant process advantages can be achieved over conventional low pressure DC plasma processing techniques when used in conjunction with sputtering materials such as titanium, copper, nickel, ruthenium, aluminum, tantalum, molybdenum, tungsten, and other materials. In one or more examples, a DC power supply included in the DC source 150 is capable of delivering between about 0.1 and about 60 KW of DC power to the target 120. In some embodiments, the RF source 281 comprises an RF power source and an RF match (not shown) that are configured to efficiently deliver RF energy to the sputtering target 120. In some examples, the RF power source is capable of generating RF currents at a frequency of between about 13.56 MHz and about 228 MHz at powers between about 0.1 and about 5 kW.

During processing, a gas, such as argon, is supplied to the processing region 110 from a gas source 162 via conduits 164. The gas source 162 may comprise an inert gas such as argon, krypton, helium or xenon, which is capable of energetically impinging upon and sputtering material from the sputtering target 120 and/or surface of the substrate 108 based on a bias applied which may be applied by the PV waveform source 144. The gas source 162 may also include a reactive gas, such as one or more of an oxygen-containing gas or a nitrogen-containing gas, which is capable of reacting with the sputtering material to form a layer on a substrate. Spent process gas and byproducts are exhausted from the processing chamber 100 through exhaust ports 166 that receive spent process gas and direct the spent process gas to an exhaust conduit having an adjustable position gate valve (not shown) to control the pressure in the processing region 110 in the processing chamber 100. The exhaust conduit is connected to one or more exhaust pumps 168, such as a cryopump. Typically, the pressure of the sputtering gas in the processing chamber 100 during processing is set to sub-atmospheric levels, such as a vacuum environment, for example, a pressure of about 0.0001 mTorr to about 300 mTorr. In some embodiments, the processing pressure is set to about 20 m Torr to about 100 mTorr.

In some embodiments, a first electromagnet assembly 170 comprises a first current source 170A configured to bias a first magnetic coil assembly 170B. The first magnetic coil assembly 170B is positioned near the sputtering target 120, configured to modulate a magnetron-controlled plasma 172. A second electromagnet assembly 174 comprises a second current source 174A configured to bias a second magnetic coil assembly 174B. The second magnetic coil assembly 174B is positioned in the central part of the chamber, and configured to modulate a central portion of a plasma 176. The plasma 176 is formed between the substrate 108 and the sputtering target 120 from the gas. Ions within the plasma 176 are accelerated toward the sputtering target 120 and cause material to become dislodged from the sputtering target 120. The dislodged target material is deposited on the substrate 108.

A lid enclosure 178 generally comprises a conductive wall 180, a center feed 182, and shielding (not shown). In this configuration, the conductive wall 180, the center feed 182, the sputtering target 120, and a portion of the motor 154 enclose and form a back region 184. The back region 184 is a sealed region disposed on the backside of the sputtering target 120 and is generally filled with a flowing liquid during processing to remove the heat generated at the sputtering target 120 during processing. In some embodiments, the conductive wall 180 and the center feed 182 are configured to support the motor 154 and magnetron system 158, so that the motor 154 can rotate the magnetron system 158 during processing. In one or more embodiments, the motor 154 is electrically isolated from the RF or DC power delivered from the power supplies by use of a dielectric layer 14, such as Delrin, G10, or Ardel. The shielding (not shown) may comprise one or more dielectric materials that are positioned to enclose and prevent the RF energy delivered to the sputtering target 120 from interfering with and affecting other processing chambers. In some embodiments, the shielding may comprise a Delrin, G10, Ardel or other similar material and/or a thin-grounded sheet metal RF shield.

To provide efficient sputtering, a magnetron system 158 is positioned behind the sputtering target 120 in the upper process assembly 102 to create a magnetic field in the processing region 110 adjacent the sputtering surface 140 of the sputtering target 120, which generates the magnetron-controlled plasma 172. A magnetic field generated by the magnetron system 158 traps electrons and ions to increase the plasma density over one or more regions of the sputtering target 120, and to increase target utilization, control deposition uniformity and the sputtering rate. In some embodiments, the magnetron system 158 includes a source magnetron assembly (not shown) that comprises an outer pole (not shown) and an inner pole (not shown). The magnetron system 158 is rotated about a central axis of the processing chamber 100 by use of the motor 154. In some embodiments, a "closed loop" magnetron configuration is formed within the magnetron system 158 such that the outer pole (not shown) of the magnetron surrounds the inner pole (not shown) of the magnetron forming a gap between the poles that is a continuous loop. In the closed loop configuration, the magnetic fields that emerge and reenter through a surface of the sputtering target form a "closed loop" pattern can be used to confine electrons near the surface of the sputtering target in a closed pattern, which is often called a "racetrack" type pattern. A closed loop, as opposed to the open loop, magnetron configuration is able to confine electrons and generate a high density plasma near the sputtering surface 140 of the sputtering target 120 to increase the sputtering yield. In some other embodiments, an "open loop" magnetron configuration is formed within the magnetron system 158 such that the outer pole of the magnetron surrounds the inner pole of the magnetron forming a gap between the poles that is a continuous loop. In an open loop magnetron configuration, the electrons trapped between the inner and outer poles will migrate, leak out, and escape from the B-fields created at open ends of the magnetron, thus only holding the electrons for a short period of time during the sputtering process due to the reduced confinement of the electrons. It has been found that the use of an open loop magnetron configuration can provide significant step coverage improvements and provide an improved material composition uniformity across the substrate surface, when used in conjunction with the RF and DC sputtering of multi-compositional targets described herein.

In some embodiments, the processing chamber 100 includes an electrode 188. The electrode 188 is also referred to as a biasable flux optimizer (BFO) and a collimator. The electrode 188 has a plurality of apertures 189 (e.g., eight are shown) configured to filter material from the sputtering target 120 though the electrode 188 and towards the substrate 108 in a manner that can control/adjust a number of ions arriving and an angle of arrival of the ions onto portions of the substrate 108. The process of "filtering" the sputtered material will include the plurality of apertures 189 formed in the electrode 188 having a structural configuration that allows a first portion of the sputtered material from the sputtering target 120 to pass through the plurality of apertures 189 in a vertical direction (e.g., Z-direction) while blocking a second portion of the sputtered material that has a primarily angular and non-vertical trajectory from making its way through the electrode 188 and reaching the surface of the substrate 108. In one or more embodiments, a DC voltage source 190 is electrically coupled to the electrode 188 and configured to apply a bias to the electrode 188, such as a positive DC bias to the electrode 188 relative to ground (e.g., the grounded chamber shield 112). The DC bias is configured to reduce the loss of sputtered metal ions sputtered from the target 120 and/or formed in the magnetron-controlled plasma 172 formed adjacent to the target surface. In some embodiments, the DC bias is a voltage in a range of about −500 V to 500 V. In other embodiments, the DC bias may be less than about −500 V or greater than about 500 V.

A grounded electrode shield 195 extends between a grounded element and the electrode 188. The grounded electrode shield 195 is positioned within the processing region 110 which is at least partially enclosed by the grounded chamber shield 112 of the process kit 104, as shown in FIG. 1. It is believed that a ratio of a surface area of the electrode 188 to a surface area of the grounded electrode shield 195 affects an angle of arrival of ions near the edge/periphery of the substrate 108. By adjusting (e.g., optimizing) the ratio of the surface area of the electrode 188 to the surface area of the grounded electrode shield 195, the angle of arrival of the ions near the edge/periphery of the substrate 108 can be increased or decreased relative to the surface of the substrate 108. In general, it is believed that increasing the ratio of the surface areas decreases the angle of arrival (e.g., closer to parallel to the surface of the substrate 108) of the ions which results in non-uniform deposition of material near the edge/periphery of the substrate 108. Generally, it is believed that decreasing the ratio of the surface areas increases the angle of arrival (e.g., closer to normal to the surface of the substrate 108) of the ions which results in uniform deposition of material near the edge/periphery of the substrate 108. The ratio of the surface area of the electrode 188 to the surface area of the grounded electrode shield 195 can be reduced by decreasing the surface area of electrode 188, increasing the surface area of the grounded electrode shield 195, or a combination thereof. Although the ratio of the surface area of the electrode 188 to the surface area of the grounded electrode shield 195 is believed to be one variable that affects the angle of arrival of the ions near the edge/periphery of the substrate 108, it is also believed that additional variables can affect the angle of arrival of the ions.

As described below, a DC voltage source 196 is electrically coupled to an electrical conductor (not shown) which may be disposed within the grounded electric shield 195 and electrically isolated from one or more portions of the grounded electric shield 195. In one or more examples, the DC voltage source 196 is configured to apply a DC bias to the electrical conductor in a range of about −500 V to 500 V. In some embodiments, the DC voltage source 196 is representative of multiple DC voltage sources which are each configured to apply a different DC bias to a corresponding electrical conductor. Applying certain DC biases to portions of the grounded electric shield 195 is also believed to affect the angle of arrival of the ions near the edge/periphery of the substrate 108. It is believed that applying a negative DC bias (e.g., of a magnitude similar to a negative DC bias applied to the substrate 108) to an electrical conductor in relatively close proximity to the substrate 108 increases the angle of arrival (e.g., closer to normal to the surface of the substrate 108) of the ions which results in uniform deposition of material near the edge/periphery of the substrate 108. As described below, it is also believed that applying a gradient of DC biases to electrical conductors disposed between the electrode 188 and substrate 108 such that the gradient of the DC biases transitions from a positive DC bias applied to a first electrical conductor near the electrode 188 to a negative DC bias applied to a second electrical conductor near the substrate 108 increases the angle of arrival (e.g., closer to normal to the surface of the substrate 108) of the ions which results in uniform deposition of material near the edge/periphery of the substrate 108.

Adjustable Grounding and Bias Area Examples

Figure 2B:
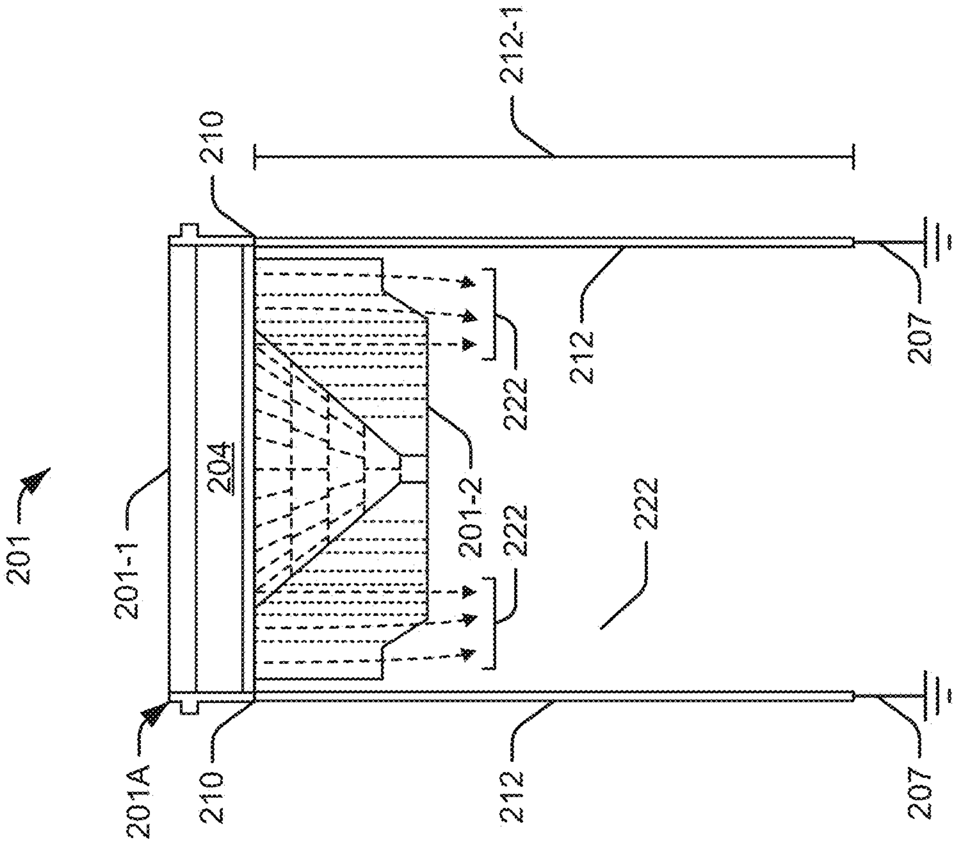
FIG. 2B illustrates a schematic representation of an electrode assembly, in accordance with certain embodiments of the present disclosure.
Figure 2A:
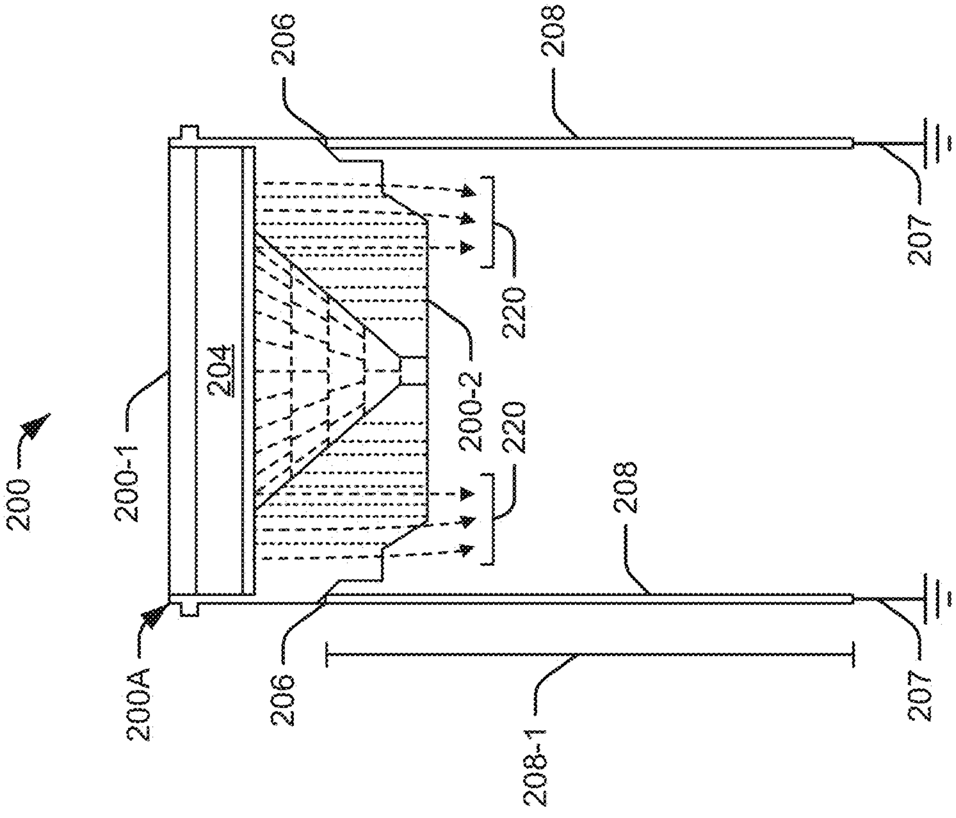
FIG. 2A illustrates a schematic representation of a baseline electrode assembly, in accordance with certain embodiments of the present disclosure.
Figure 2C:
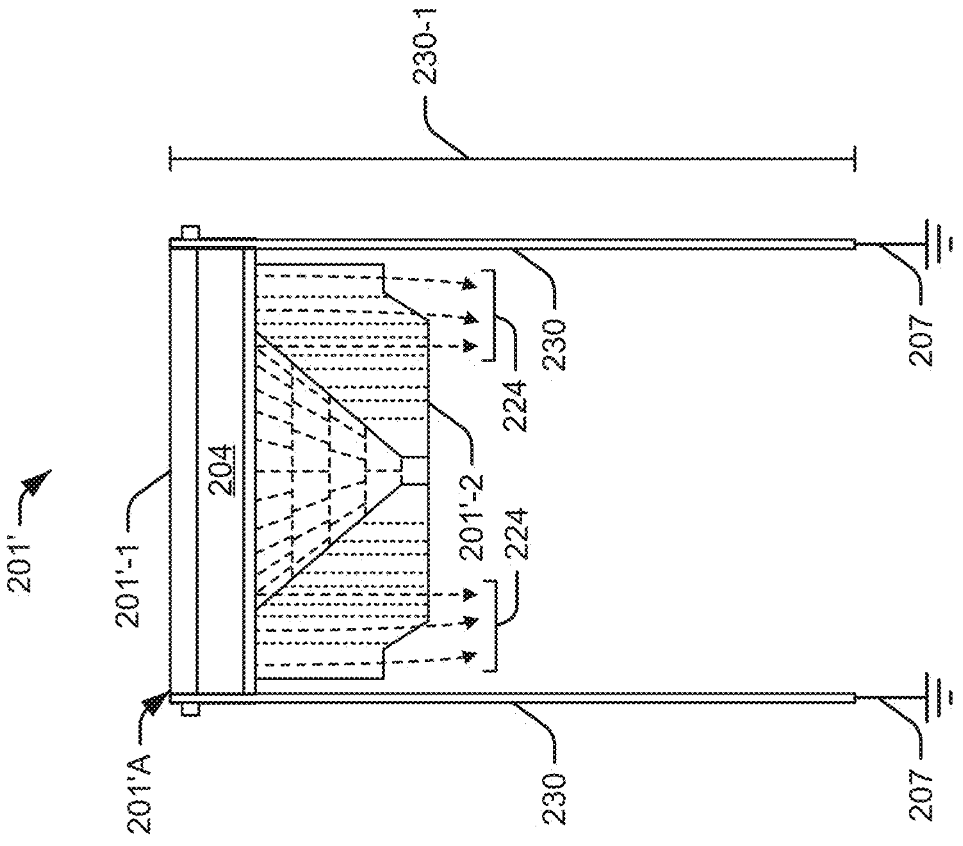
FIG. 2C illustrates a schematic representation of an assembly with an electrode disposed between portions of a grounded electrode shield, in accordance with certain embodiments of the present disclosure.

FIG. 2A illustrates a schematic representation of a baseline electrode assembly 200. In some embodiments, the baseline electrode assembly 200 represents a variation of the electrode 188 which is usable in the processing chamber 100 in place of the electrode 188. The baseline electrode assembly 200 is also referred to as a baseline biasable flux optimizer (BBFO) and a baseline collimator. FIG. 2B illustrates a schematic representation of an electrode assembly 201. Like the baseline electrode assembly 200, the electrode assembly 201 represents a variation of the electrode 188 that is usable in the processing chamber 100 in place of the electrode 188. The electrode assembly 201 is also referred to as a biasable flux optimizer (BFO) and a collimator. FIG. 2C illustrates a schematic representation of an assembly 201' with an electrode 201'A disposed between portions of a grounded electrode shield 230. The assembly 201' can also be used in the processing chamber 100 to contribute functionality that is similar to or the same as the functionality contributed by the electrode 188. In various embodiments, the baseline electrode assembly 200, the electrode assembly 201, and the assembly 201' are each configured to filter positively charged ions and neutrals provided from the sputtering target 120 towards the substrate 108 during a sputtering process.

The baseline electrode assembly 200 includes an electrode 200A that has a top side 200-1, a bottom side 200-2, and an upper portion 204 which includes the top side 200-1. The baseline electrode assembly 200 also includes interfaces 206 which are configured to allow the electrode 200A to interface with a grounded electrode shield 208. As shown in FIG. 2A, ion flux 220 indicates plasma transport of a plasma (not shown) through the electrode 200A. In some embodiments, the interfaces 206 include a dielectric material spacer (e.g., alumina block) that is configured to electrically isolate the grounded electrode shield 208 from the electrode 200A. In one or more embodiments, the grounded electrode shield 208 represents a variation of the grounded electrode shield 195 (FIG. 1) which may be used in the processing chamber 100 in place of the grounded electrode shield 195. The grounded electrode shield 208 extends a first distance 208-1 between a grounding element 207 (e.g., conductive strap) and the electrode 200A of the baseline electrode assembly 200. In some examples, the grounding element 207 has a ground potential.

The electrode assembly 201 includes an electrode 201A that has a topside 201-1, a bottom side 201-2, and the upper portion 204. As depicted in FIG. 2B, ion flux 222 indicates plasma transport of a plasma (not shown) through the electrode 201A. In some embodiments, the electrode 200A of the baseline electrode assembly 200 has a first surface area, the electrode 201A of the electrode assembly 201 has a second surface area, and the second surface area is less than the first surface area. The surface area of the electrode 201A will include the areas of all of the exposed surfaces of the electrode 201A, such as, for example, the surface area of the inner and outer surfaces of apertures 189 and upper portion 240. The surface area of the grounded electrode shield 208 will include the area of the inner surface of the grounded electrode shield 208, which is exposed within the processing region 110. In various embodiments, the first surface area can be in a range of about 1000 to 5000 square inches ($in^2$) such as about 2500 $in^2$ and the second surface area may be in a range of about 500 to 4500 $in^2$ such as about 1700 $in^2$. Compared to the electrode 200A itself, the portion forming the interfaces 206 is not included in the electrode 201A. Since the electrode 201A does not include the portion forming the interfaces 206, and assuming that surface areas formed by the apertures 189 through the electrodes 200A, 201A are fixed for comparison purposes, the second surface area is about 5 to 85 percent less than the first surface area. In some embodiments, the second surface area is more than about 85 percent less than the first surface area or less than about 5 percent less than the first surface area.

As shown in the illustrated example, the electrode assembly 201 includes interfaces 210 that are configured to interface with a grounded electrode shield 212. In some embodiments, the interfaces 210 include a dielectric material spacer (e.g., alumina block) that is configured to electrically isolate the grounded electrode shield 212 from the electrode 201A. In one or more embodiments, the grounded electrode shield 212 represents a variation of the grounded electrode shield 195 which can be used in the processing chamber 100 in place of the grounded electrode shield 195. The grounded electrode shield 212 extends a second distance 212-1 between the grounding element 207 and the electrode 201A, and the second distance 212-1 is greater than the first distance 208-1. As described below, the second distance 212-1 can be increased by adding a spacer (FIGS. 3A-4B) between the grounded electrode shield 212 and the electrode 201A and the second distance 212-1 may be decreased by removing the spacer between the grounded electrode shield 212 and the electrode 201A.

Because the second distance 212-1 is greater than the first distance 208-1, a surface area of the grounded electrode shield 212 is greater than a surface area of the grounded electrode shield 208. In one or more embodiments, the surface area of the grounded electrode shield 208 can be in a range of about 1500 $in^2$ to 6000 $in^2$ such as about 3200 $in^2$ and the surface area of the grounded electrode shield 212 may be in a range of about 2000 $in^2$ to 8000 $in^2$ such as about 4400 $in^2$. Additionally, in some examples, the first surface area of the electrode 200A is greater than the second surface area of the electrode 201A. Accordingly, a first ratio of the first surface area of the electrode 200A to the surface area of the grounded electrode shield 208 is greater than a second ratio of the second surface area of the electrode 201A to the surface area of the grounded electrode shield 212. In some embodiments, the first ratio is a relatively high ratio which may be greater than about 0.5 and the second ratio is a relatively low ratio which may be less than about 0.4. In various embodiments, the first ratio is a ratio in a range of about 0.25 to 0.95 such as about 0.78 while the second ratio may be a ratio in a range of about 0.15 to 0.65 such as about 0.39. For example, the second ratio can be about 5 to 85 percent less than the first ratio. Notably, in some embodiments, the second ratio can be greater than about 85 percent less than the first ratio or less than about 5 percent less than the first ratio.

The assembly 201' includes the electrode 201'A which is disposed between portions of the grounded electrode shield 230. The electrode 201'A includes a top side 201'-1, a bottom side 201'-2, and the upper portion 204. As shown in FIGS. 2B and 2C, the assembly 201' is similar to the electrode assembly 201 but the assembly 201' does not include interfaces for the grounded electrode shield 230. Ion flux 224 indicates plasma transport of a plasma (not shown) through the electrode 201'A. The electrode assembly 201 includes the interfaces 210 that interface with grounded electrode shield 212; however, in the assembly 201', the grounded electrode shield 230 extends to the topside 201'-1 of the electrode 201'A. Accordingly, the grounded electrode shield 230 of the assembly 201' extends a third distance 230-1 that is greater than the second distance 212-1 extended by the grounded electrode shield 212 of the electrode assembly 201.

In various embodiments, electrode 201'A of the assembly 201' has a third surface area and the second surface area of the electrode 201A of the electrode assembly 201 is greater than the third surface area. In one or more embodiments, a third surface area of the grounded electrode shield 230 may be greater than the second surface area of the grounded electrode shield 212. In some embodiments, a third ratio of the third surface area of the electrode 201'A to the surface area of the grounded electrode shield 230 is greater than the second ratio of the second surface area of the electrode 201A to the surface area of the grounded electrode shield 212. In other embodiments, the third ratio of the third surface area of the electrode 201'A to the surface area of the grounded electrode shield 230 is less than or equal to the second ratio of the second surface area of the electrode 201A to the surface area of the grounded electrode shield 212.

Figure 2D:
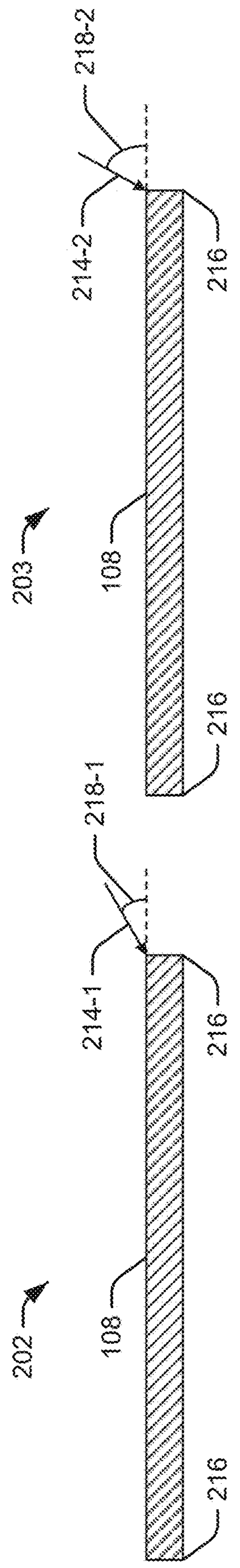
FIG. 2D illustrates schematic representations of an ion angle for a baseline electrode assembly and an ion angle for an electrode assembly, in accordance with certain embodiments of the present disclosure.

FIG. 2D illustrates schematic representations 202, 203 of an ion angle 218-1 for a baseline electrode assembly 200 and an ion angle 218-2 for an electrode assembly 201. The representation 202 includes the substrate 108 in the processing chamber 100 in an example in which the electrode 188 is replaced with the baseline electrode assembly 200 and the grounded electrode shield 195 is replaced with the grounded electrode shield 208. At an edge 216 of the substrate 108 an ion 214-1 arrives at the ion angle 218-1. As shown, the ion angle 218-1 is relatively small because the first ratio of the first surface area of the baseline electrode assembly 200 to the surface area of the grounded electrode shield 208 is relatively high. Since the ion angle 218-1 is relatively small, material from the sputtering target 120 is not uniformly deposited on the substrate 108 near the edge 216. In an example in which the substrate 108 includes high aspect ratio features such as trenches or vias, the ion angle 218-1 causes material deposited in the high aspect ratio features to have sidewall asymmetry.

The representation 203 includes the substrate 108 in the processing chamber 100 in an example in which the electrode 188 is replaced with the electrode 201A and the grounded electrode shield 195 is replaced with the grounded electrode shield 212. An ion 214-2 arrives at the edge 216 of the substrate 108 at the ion angle 218-2. The ion angle 218-2 is relatively large because the second ratio of the second surface area of the electrode 201A to the surface area of the grounded electrode shield 212 is relatively low. For instance, the ion angle 218-2 is closer to normal relative to the substrate 108 than the ion angle 218-1. Material from the sputtering target 120 is uniformly deposited on the substrate 108 near the edge 216 because the ion angle 218-2 is relatively large. In the example in which the substrate 108 includes the high aspect ratio features, the ion angle 281-2 causes material deposited in the high aspect ratio features to have symmetric sidewalls.

Figure 3A:
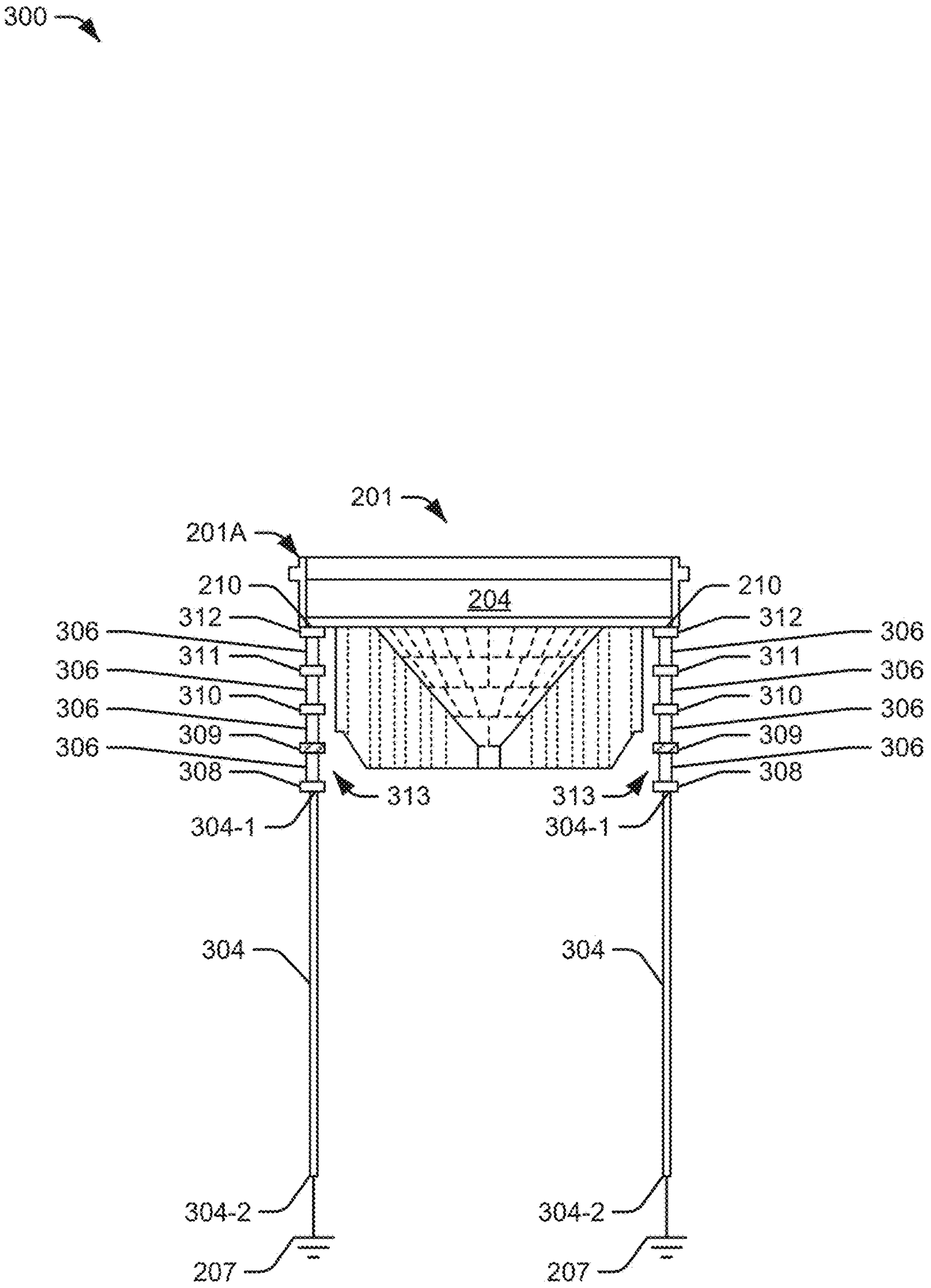
FIGS. 3A and 3B illustrate schematic representations of spacers added between a grounded electrode shield and an electrode, in accordance with certain embodiments of the present disclosure.
Figure 3B:
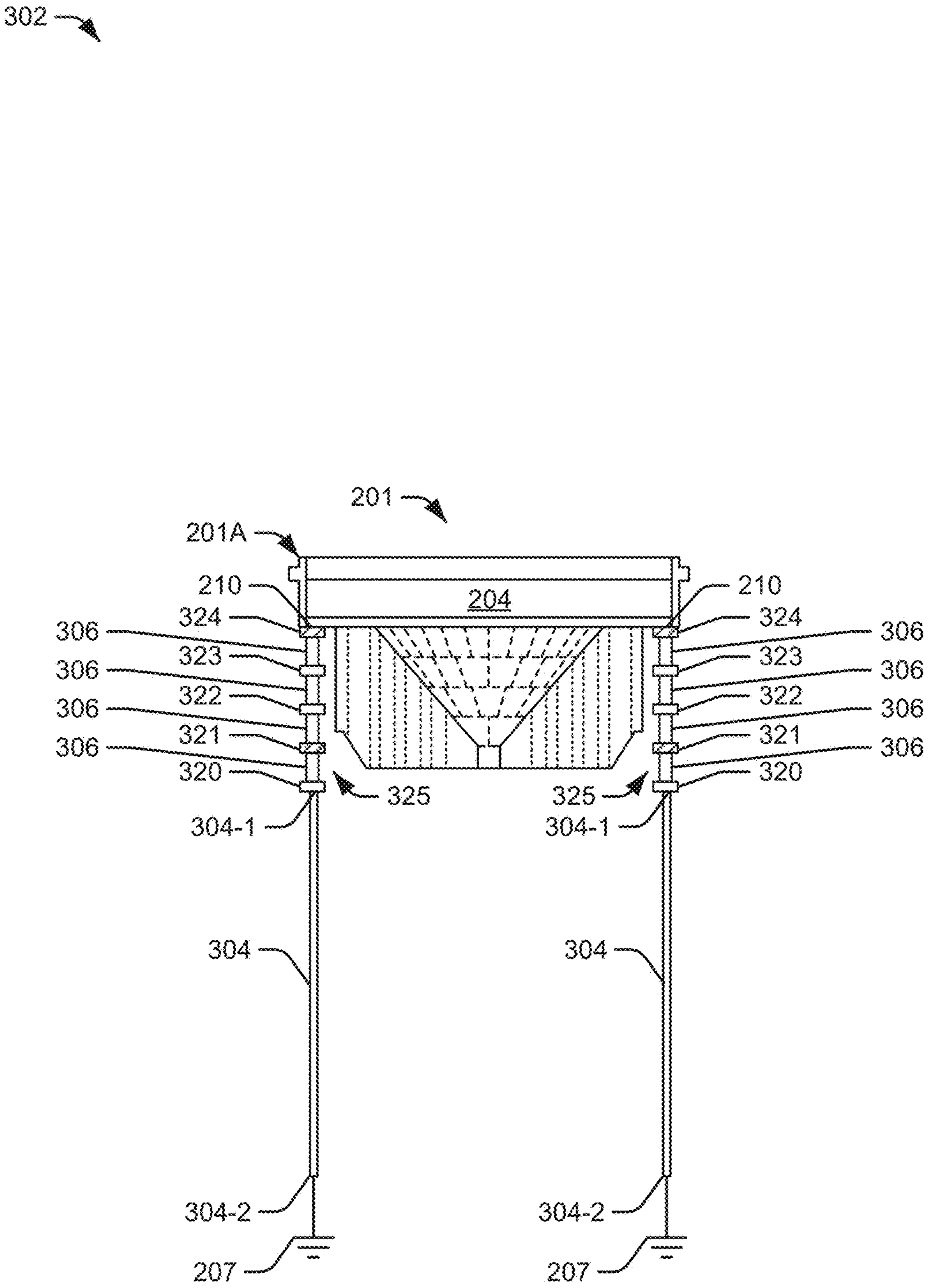

FIGS. 3A and 3B illustrate schematic representations 300, 302 of spacers added between a grounded electrode shield 304 and an electrode 201A. FIG. 3A illustrates the representation 300 which includes the electrode 201A and the grounded electrode shield 304. In various examples, the grounded electrode shield 304 represents a variation of the grounded electrode shield 195, and the grounded electrode shield 304 can be used in the processing chamber 100 in place of the grounded electrode shield 195. The grounded electrode shield 304 includes a first end 304-1 and a second end 304-2. In some embodiments, the first end 304-1 is an electrically conductive portion of the grounded electrode shield 304. In the illustrated example, the second end 304-2 is electrically coupled to the grounding element 207.

As shown in FIG. 3A, extenders 306 and spacers 308-312 are disposed between the first end 304-1 of the grounded electrode shield 304 and the interfaces 210 of the electrode assembly 201. The extenders 306 are disposed between pairs of the spacers 308-312. Although the extenders 306 and the spacers 308-312 are described as separate elements, it is to be appreciated that the extenders and the pairs of the spacers 308-312 can be combined as single elements. In some embodiments, the extenders 306 are electrical conductors and the spacers 308-312 can be electrical conductors or electrical insulators. In the representation 300, the spacer 309 is an electrical insulator and the spacer 308 is an electrical conductor. The spacers 310-312 are also electrical conductors. Because the spacer 309 is disposed between the first end 304-1 of the grounded electrode shield 304 and the electrode 201A, the grounded electrode shield 304 is electrically isolated from the electrode 201A.

In one or more embodiments, the spacer 308 and an extender 306 that is disposed between the spacer 308 and the spacer 309 form an increased surface area 313 for the grounded electrode shield 304. Accordingly, adding the spacer 308 between the first end 304-1 (e.g., the electrically conductive portion of the grounded electrode shield 304) and the electrode 201A increases a surface area of the grounded electrode shield 304. For example, the increased surface area 313 decreases a ratio of the surface area of the electrode 201A to the surface area of the grounded electrode shield 304. Conversely, removing the spacer 308 between the first end 304-1 (e.g., the electrically conductive portion of the grounded electrode shield 304) and the electrode 201A decreases the surface area of the grounded electrode shield 304 and increases the ratio of the surface area of the electrode 201A to the surface area of the grounded electrode shield 304. In some examples, the spacers 310-312 are biased at the positive DC bias applied to the electrode 201A.

FIG. 3B illustrates the representation 302 which includes the electrode 201A, the grounded electrode shield 304, and the extenders 306 disposed between pairs of spacers 320-324. The extenders 306 and the spacers 320-324 are disposed between the first end 304-1 of the grounded electrode shield 304 and the interfaces 210 of the electrode 201A. In the representation 302, the spacer 320 is an electrical conductor, the spacer 321 is an electrical insulator, the spacer 322 is an electrical conductor, the spacer 323 is an electrical conductor, and the spacer 324 is an electrical insulator. The grounded electrode shield 304 is electrically isolated from the electrode 201A because the spacer 321 and the spacer 324 are disposed between the first end 304-1 of the grounded electrode shield 304 and the electrode 201A. In some examples, the spacers 322, 323 and the extenders 306 that are disposed between the spacer 321 and the spacer 324 form a floating portion which is electrically isolated from both the electrode 201A and the grounded electrode shield 304. In one or more embodiments, the spacer 320 and an extender 306 that is disposed between the spacer 320 and the spacer 321 form an increased surface area 325 for the grounded electrode shield 304. Like the increased surface area 313, the increased surface area 325 decreases the ratio of the surface area of the electrode 201A to the surface area of the grounded electrode shield 304.

Although the examples described above with reference to FIGS. 3A and 3B include the electrode 201A of the electrode assembly 201, it is to be appreciated that, in various embodiments, the electrode 201A of the electrode assembly 201 is replaceable with the electrode 200A of the baseline electrode assembly 200 or with the electrode 201'A of the assembly 201'. Further, while particular example arrangements of the extenders 306, the spacers 308-312, and the spacers 320-324 with respect to the electrode 201A and the grounded electrode shield 304 are illustrated and described, it is also to be appreciated that variations of these arrangements can be implemented to increase or decrease the increased surface areas 313, 325. Notably, such variations can also be implemented to increase or decrease the ratio of the surface area of the electrode 201A to the surface area of the grounded electrode shield 304.

Figure 4A:
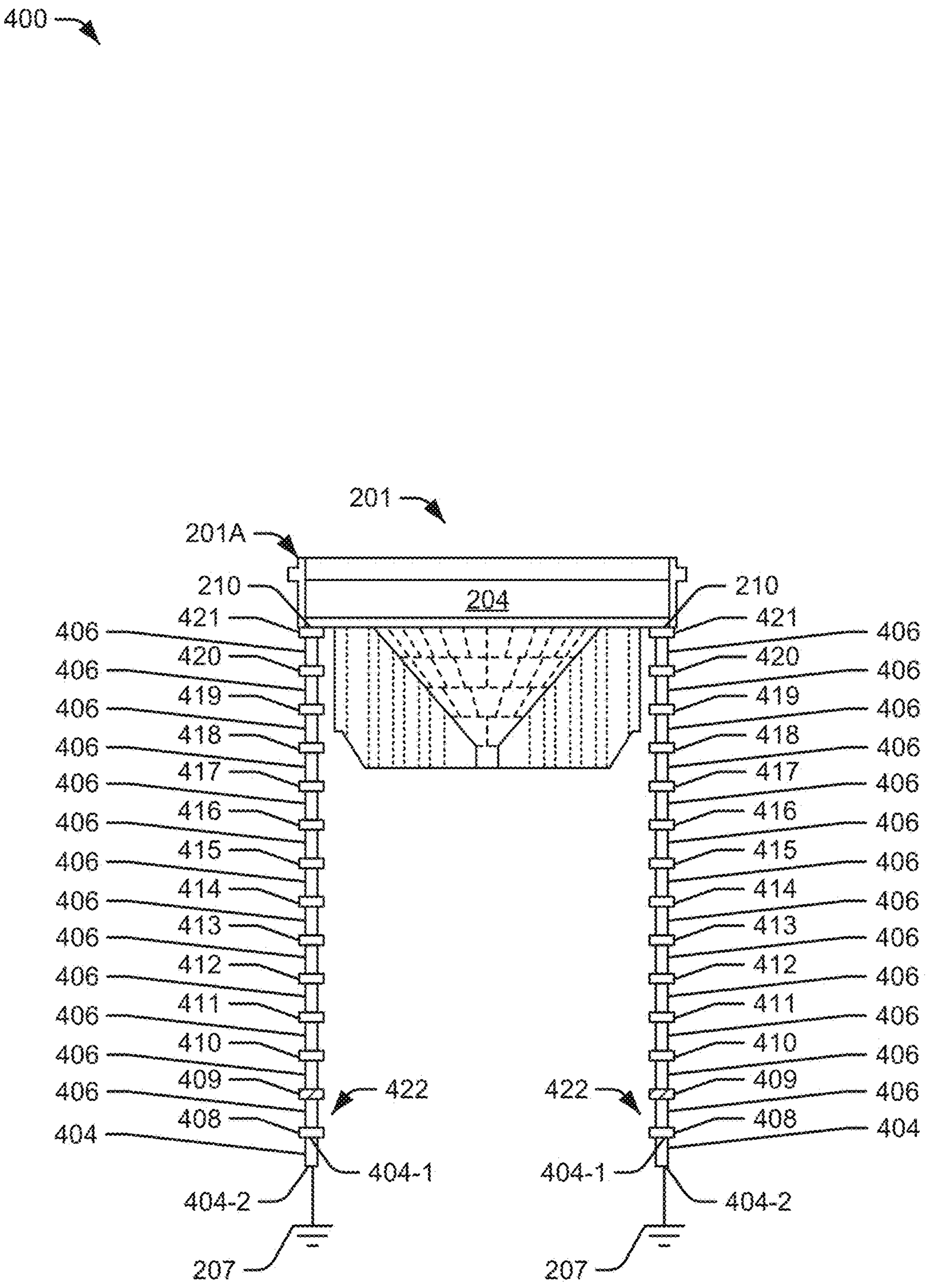
FIGS. 4A,4B, and 4C illustrate schematic representations of spacers added between a grounding element and an electrode, in accordance with certain embodiments of the present disclosure.
Figure 4B:
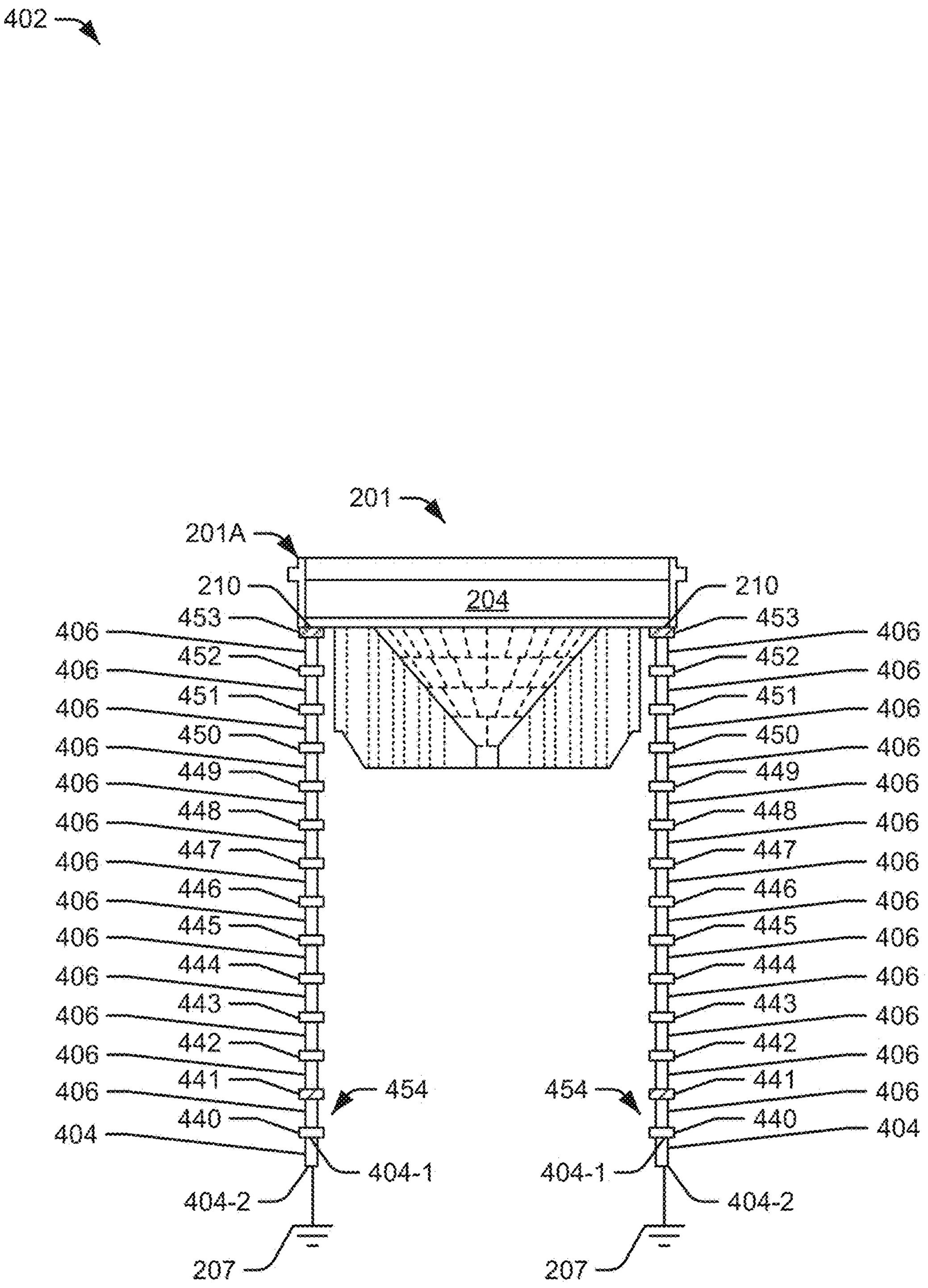
Figure 4C:
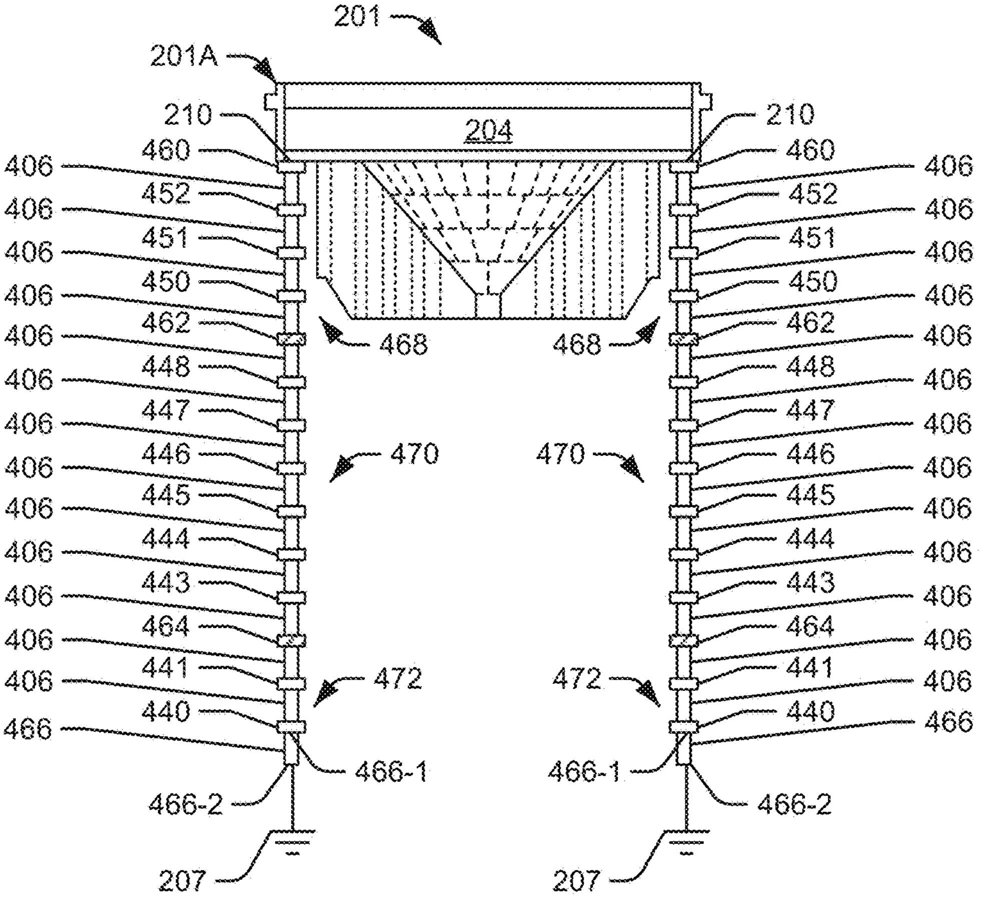

FIGS. 4A, 4B, and 4C illustrate schematic representations 400, 402, 403 of spacers added between a grounding element 404 and an electrode 201A. FIG. 4A illustrates the representation 400 which includes the electrode 201A, the grounding element 404, extenders 406, and spacers 408-421. The grounding element 404 includes a first end 404-1 and a second end 404-2. In some examples, the second end 404-2 is electrically coupled to (or includes) the grounding element 207. The extenders 406 are disposed between pairs of the spacers 408-421 and both the extenders 406 and the spacers 408-421 are disposed between the first end 404-1 of the grounding element 404 and the interfaces 210 of the electrode 201A. Although the extenders 406 and the spacers 408-421 are illustrated and described as separate elements, it is to be appreciated that, in various examples, some or all of the extenders 406 and the spacers 408-421 can be combined into single elements.

In some embodiments, the grounding element 404, the extenders 406, and the spacers 408-421 collectively represent a variation of the grounded electrode shield 195, and the grounding element 404, the extenders 406, and the spacers 408-421 can be used in the processing chamber 100 in place of the grounded electrode shield 195. In various examples, the extenders 406 are electrical conductors and the spacers 408-421 can be electrical conductors or electrical insulators. In the representation 400, the spacer 408 is an electrical conductor, the spacer 409 is an electrical insulator, and the spacers 410-421 are electrical conductors. Because of the spacer 409, the grounding element 404 is electrically isolated from the electrode 201A. The spacer 408 and an extender 406 that is disposed between the spacer 408 and the spacer 409 form an increased surface area 422 for the grounding element 404. In some examples, the increased surface area 422 decreases a ratio of the surface area of the electrode 201A to a surface area of the grounding element 404. Notably, by replacing the spacer 409 with an electrical conductor and replacing the spacer 410 with an electrical insulator, the increased surface area 422 can be further increased to further decrease the ratio of the surface area of the electrode 201A to the surface area of the grounding element 404.

FIG. 4B illustrates the representation 402 which includes the electrode 201A, the grounding element 404, the extenders 406, and spacers 440-453. As shown, the extenders 406 are disposed between pairs of the spacers 440-453. Both the extenders 406 and the spacers 440-453 are disposed between the grounding element 404 and the electrode 201A. In some examples, the spacer 440 is an electrical conductor, the spacer 441 is an electrical insulator, the spacers 442-452 are electrical conductors, and the spacer 453 is an electrical insulator. Because the spacer 441 and the spacer 453 are disposed between the grounding element 404 and the electrode 201A, the grounding element 404 is electrically isolated from the electrode 201A. The spacers 442-452 and extenders 406 that are disposed between the spacer 441 and the spacer 453 form a floating portion which is electrically isolated from both the electrode 201A and the grounding element 404. In some embodiments, the spacer 440 and an extender 406 disposed between the spacer 440 and the spacer 441 form an increased surface area 454 for the grounding element 404. Like the increased surface area 422, the increased surface area 454 decreases the ratio of the surface area of the electrode 201A to the surface area of the grounding element 404.

While the examples described above with reference to FIGS. 4A and 4B include the electrode 201A of the electrode assembly 201, it is to be appreciated that, in various embodiments, the electrode 201A of the electrode assembly 201 is replaceable with the electrode 200A of the baseline electrode assembly 200 or with the electrode 201'A of the assembly 201'. Although particular example arrangements of the grounding element 404, the extenders 406, the spacers 408-421, and the spacers 440-453 with respect to the electrode 201A are illustrated and described, it is also to be appreciated that variations of these arrangements may be implemented to increase or decrease the increased surface areas 422, 454. Further, such variations may also be implemented to increase or decrease the ratio of the surface area of the electrode 201A to the surface area of the grounding element 404.

FIG. 4C illustrates the representation 403 which includes the electrode 201A, a floating element 466, and the extenders 406. The representation 403 is similar to the representation 402 but the representation 403 includes a biased region 468, a grounded region 470, and a floating region 472. As shown, spacer 460 is an electrical conductor, spacer 462 is an electrical insulator, and the spacers 450-452 are electrical conductors. The biased region 468 is formed between the electrode 201A and the spacer 462. In some examples, the biased region 468 is biased with the electrode 201A (e.g., at a first positive DC bias). In other examples, the spacer 460 is an electrical insulator and the biased region 468 can be biased at a different potential than the electrode 201A (e.g., at a second positive DC bias or another DC bias).

In some embodiments, spacer 464 is an electrical insulator and the spacers 443-448 are electrical conductors. The grounded region 470 is formed between the spacers 462, 464 which are both electrical conductors. In one or more embodiments, the grounded region 470 is electrically coupled to the grounding element 207 (or another grounding element) such that the grounded region 470 has a ground potential.

The spacers 440, 441 are electrical conductors which form the floating region 472 along with the floating element 462. In one or more examples, the floating element 472 has a DC bias similar to a DC bias of the substrate 108 (e.g., a negative DC bias). In various embodiments, the grounded region 468 is grounded and the floating region 472 is floating at the DC bias of the substrate 108. In some embodiments, the floating region 472 can be biased at a different bias than the substrate 108 by adding additional spacers that are electrical insulators to the floating region 472 (e.g., between the floating region 472 and the substrate 108). As described above, it is to be appreciated that variations of the illustrated arrangements may be implemented such that surface areas of the biased region 468, the grounded region 470, and the floating region 472 can each be increased or decreased.

Figure 5A:
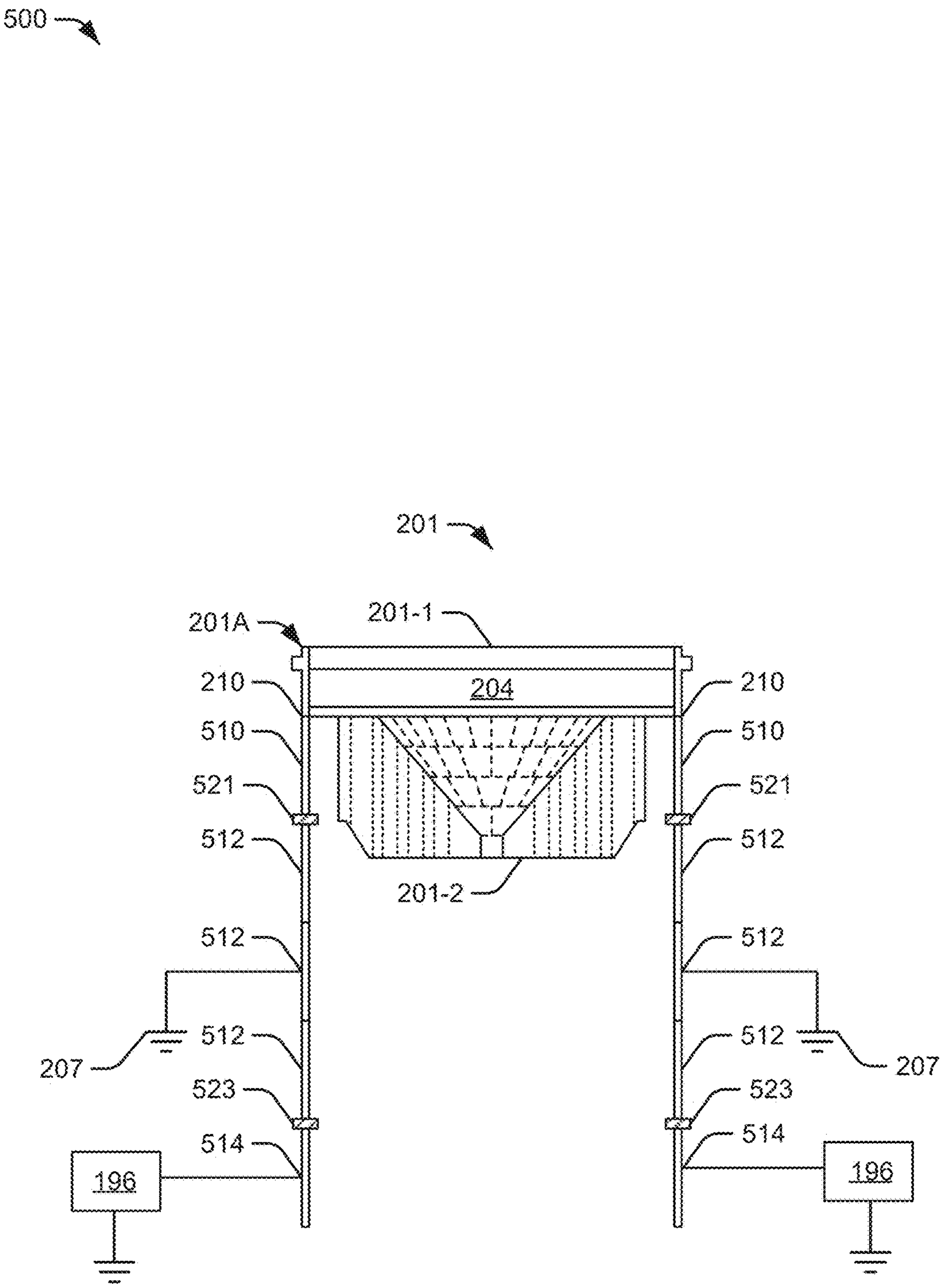
FIGS. 5A and 5B illustrate schematic representations of spacers added between a substrate and an electrode, in accordance with certain embodiments of the present disclosure.
Figure 5B:
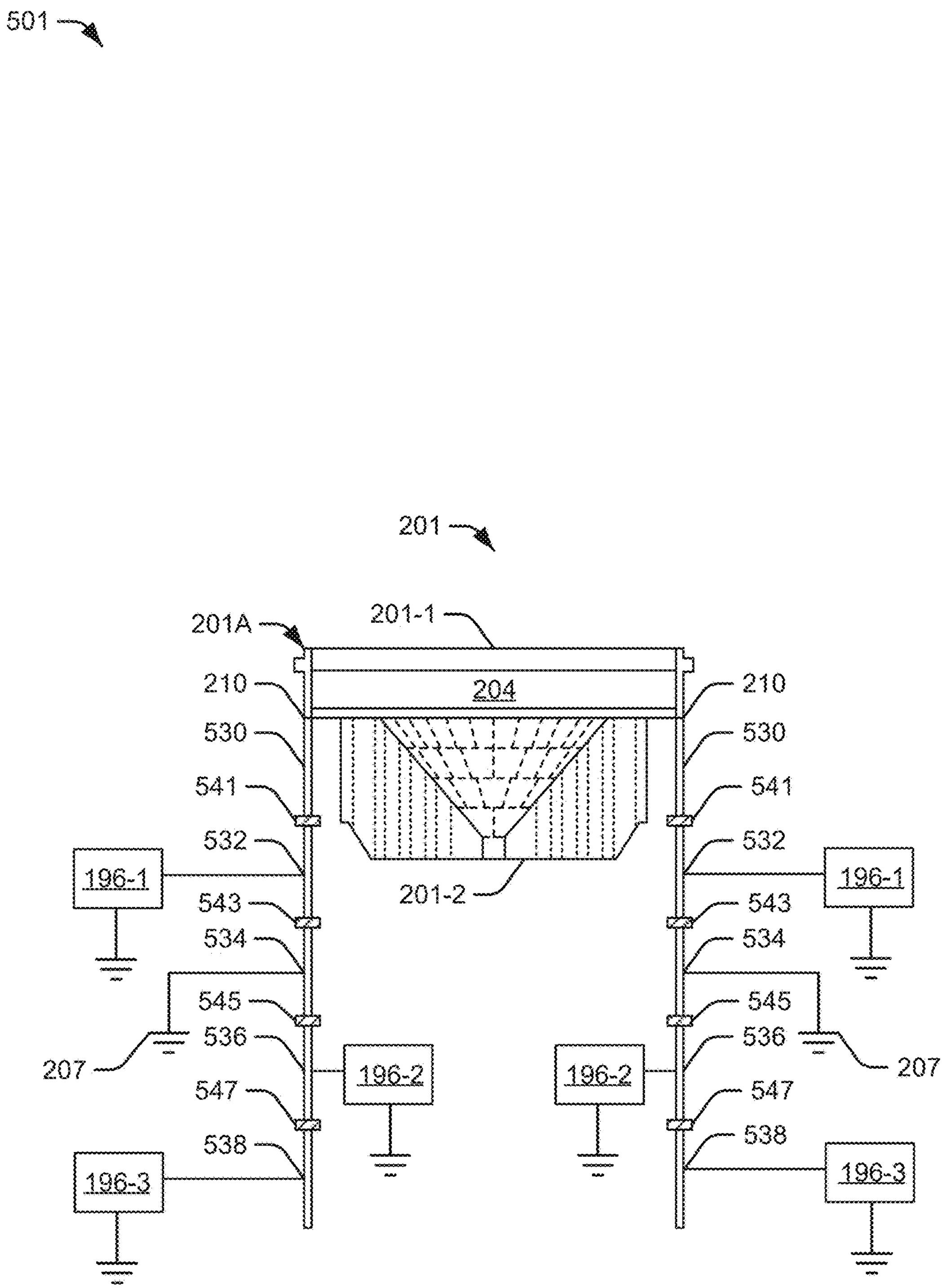

FIGS. 5A and 5B illustrate schematic representations 500, 501 of spacers added between a substrate 108 and an electrode 201A. FIG. 5A illustrates the representation 500 which includes the electrode 201A, electrical conductors 510, 512, 514, and spacers 521, 523. As shown, the spacers 521, 523 are electrical insulators. The spacers 521 electrically isolate the electrical conductors 510 from the electrical conductors 512 and the spacers 523 electrically isolate the electrical conductors 512 from the electrical conductors 514. In some embodiments, the electrical conductors 510 are electrically coupled to the electrode 201A and the electrical conductors 510 are biased at the positive DC bias applied to the electrode 201A by the DC voltage source 190. In some examples, the electrical conductors 510 are biased at a positive DC voltage in a range of about 100 to 200 V such as about 150 V.

In one or more embodiments, the electrical conductors 512 are electrically coupled to the grounding element 207 and the electrical conductors 512 have a ground potential (e.g., the electrical conductors 512 are grounded relative to the electrode 201A). The electrical conductors 514 are electrically coupled to the DC voltage source 196 which applies a negative DC bias to the electrical conductors 514. In some embodiments, the electrical conductors 514 are biased at a negative DC voltage in a range of about −200 to −500 V such as about −350 V. For example, the electrical conductors 514 are biased at a negative DC bias having a magnitude similar to a magnitude of a negative DC bias of the substrate 108. In one or more embodiments, the electrical conductors 514 are in relatively close proximity to the substrate 108 which increases an angle of arrival (e.g., closer to normal to the surface of the substrate 108) for ions and results in uniform deposition of material near the edge/periphery of the substrate 108. In some embodiments, the positive DC bias of the electrical conductors 510, the ground potential of the electrical conductors 512, and the negative DC bias of the electrical conductors 514 forms a gradient of DC biases that increases the angle of arrival (e.g., closer to normal to the surface of the substrate 108) for the ions which results in uniform deposition of material near the edge/periphery of the substrate 108.

FIG. 5B illustrates the representation 501 which includes the electrode 201A, electrical conductors 530, 532, 534, 536, 538, and spacers 541, 543, 545, 547. In various embodiments, the spacers 541, 543, 545, 547 are electrical insulators. The spacers 541 electrically isolate the electrical conductors 530 from the electrical conductors 532; the spacers 543 electrically isolate the conductors 532 from the electrical conductors 534; the spacers 545 electrically isolate the conductors 534 from the electrical conductors 536; and the spacers 547 electrically isolate the conductors 536 from the electrical conductors 538. As shown in FIG. 5B, the electrical conductors 530 are electrically coupled to the electrode 201A. The electrical conductors 530 are biased at the positive DC bias applied to the electrode 201A by the DC voltage source 190 which is the positive DC voltage in a range of about 100 to 200 V such as about 150 V.

The electrical conductors 532 are electrically coupled to a first DC voltage source 196-1 which applies a positive DC bias to the electrical conductors 532. In some embodiments, the electrical conductors 532 are biased at a positive DC voltage in a range of about 75 to 125 V such as about 90 V. In one or more embodiments, the electrical conductors 342 are electrically coupled to the grounding element 207 and the electrical conductors 534 have a ground potential (e.g., the electrical conductors 534 are grounded relative to the electrode 201A). The electrical conductors 536 are electrically coupled to a second DC voltage source 196-2 which applies a negative DC bias to the electrical conductors 536. In certain embodiments, the electrical conductors 536 are biased at a negative DC voltage in a range of about −100 to −200 V such as about −150 V.

As shown, the electrical conductors 538 are electrically coupled to a third DC voltage source 196-3 which applies a negative DC bias to the electrical conductors 538. In some embodiments, the electrical conductors 538 are biased at a negative DC voltage in a range of about −200 to −500 V such as about −350 V. In various examples, the electrical conductors 538 are biased at a negative DC bias having a magnitude similar to a magnitude of a negative DC bias of the substrate 108. In one or more embodiments, the electrical conductors 538 are in relatively close proximity to the substrate 108 which increases an angle of arrival (e.g., closer to normal to the surface of the substrate 108) for ions and results in uniform deposition of material near the edge/periphery of the substrate 108. In some examples, the positive DC bias of the electrical conductors 530, the positive DC bias of the electrical conductors 532, the ground potential of the electrical conductors 534, the negative DC bias of the electrical conductors 536, and the negative DC bias of the electrical conductors 538 forms a gradient of DC biases that increases the angle of arrival (e.g., closer to normal to the surface of the substrate 108) for the ions which results in uniform deposition of material near the edge/periphery of the substrate 108.

Although the examples described above with reference to FIGS. 5A and 5B include the electrode 201A of the electrode assembly 201, it is to be appreciated that, in various embodiments, the electrode 201A of the electrode assembly 201 is replaceable with the electrode 200A of the baseline electrode assembly 200 or with the electrode 201'A of the assembly 201'. Further, while particular example arrangements of the electrical conductors 510, 512, 514, the electrical conductors 530, 532, 534, 536, 538, the spacers 521, 523, and the spacers 541, 543, 545, 547 with respect to the electrode 201A are illustrated and described, it is also to be appreciated that variations of these arrangements can be implemented to increase or decrease the angle of arrival for the ions relative to the substrate 108. As described above, increasing or decreasing the angle of arrival for the ions adjusts the uniformity of material deposition on the substrate 108 (e.g., near the edge/periphery of the substrate 108).

Figure 6:
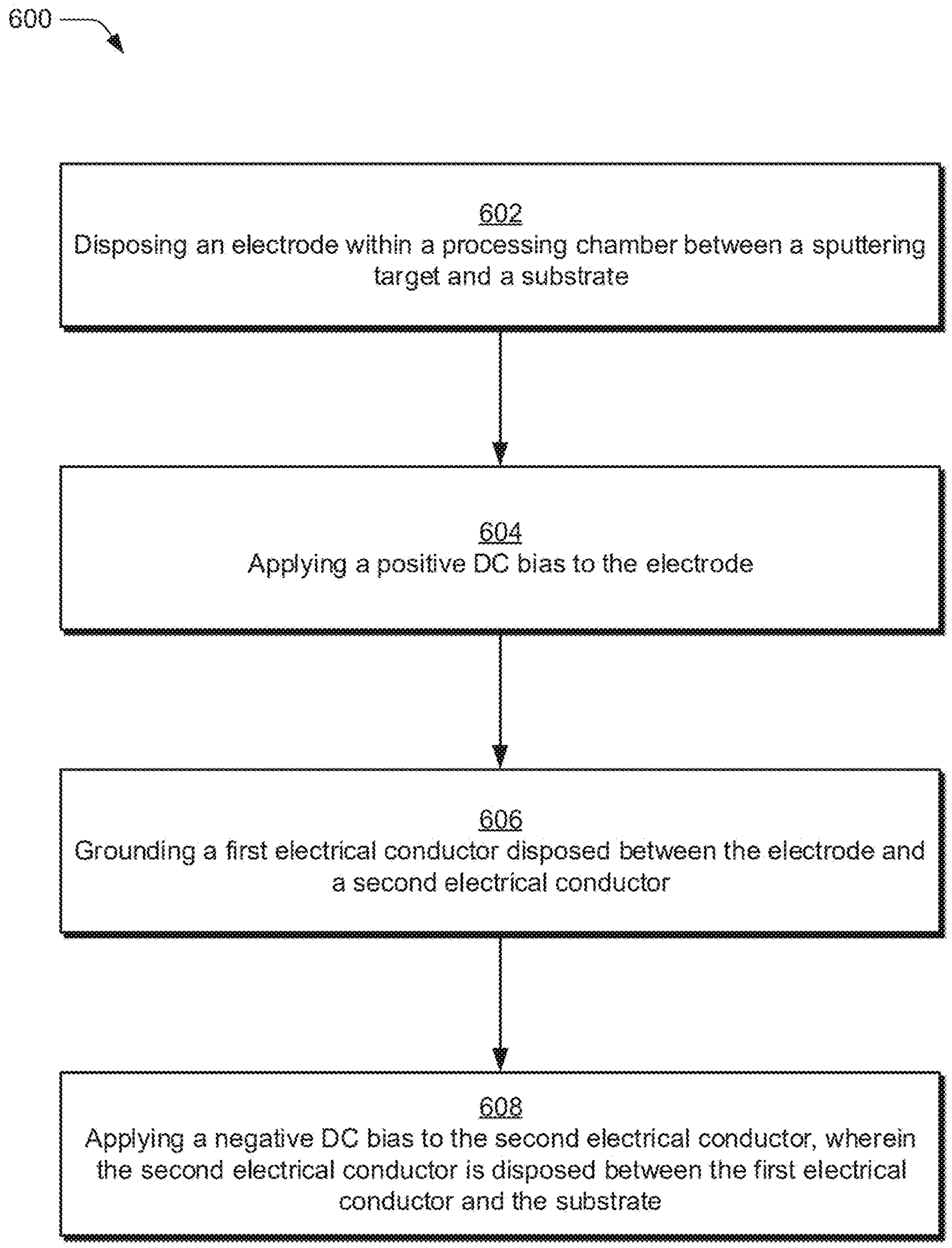
FIG. 6 is a process flow diagram illustrating a method for applying a DC bias between an electrode and a substrate, in accordance with certain embodiments of the present disclosure.

FIG. 6 is a process flow diagram illustrating a method 600 for applying a DC bias between an electrode and a substrate. At operation 602, an electrode is disposed within a processing chamber between a sputtering target and a substrate. In some embodiments, the electrode assembly 201 is disposed within the processing chamber 100 between the sputtering target 120 and the substrate 108.

At operation 604, a positive DC bias is applied to the electrode. In one or more embodiments, the DC voltage source 190 applies the positive DC bias to the electrode 201A.

At operation 606, a first electrical conductor disposed between the electrode and a second electrical conductor is grounded. In some embodiments, the electrical conductors 512, 534 are electrically coupled to the grounding element 207.

At operation 608, a negative DC bias is applied to the second electrical conductor, wherein the second electrical conductor is disposed between the first electrical conductor and the substrate. In one or more embodiments, the electrical conductors 514, 538 are electrically coupled to the DC voltage source 196 and the third DC voltage source 196-3, respectively. The DC voltage source 196 and the third DC voltage source 196-3 apply negative DC biases to the electrical conductors 514, 538, respectively, that have magnitudes similar to a magnitude of a negative DC bias of the substrate 108.

ADDITIONAL CONSIDERATIONS

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined, or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Furthermore, any claimed implementation is considered to be applicable to at least a computer-implemented method; a non-transitory, computer-readable medium storing computer-readable instructions to perform the computer-implemented method; and a computer system including a computer memory interoperability coupled with a hardware processor configured to perform the computer-implemented method or the instructions stored on the non-transitory, computer-readable medium.

As used herein, "a CPU", "controller", "a processor", "at least one processor", or "one or more processors", generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, "a memory", "at least one memory", or "one or more memories", generally refers to a single memory configured to store data and/or instructions, multiple memories configured to collectively store data and/or instructions.

As used herein, "gas" and "fluid" may be used interchangeable with either term generally referring to elements, compounds, materials, etc., having the properties of a gas, a fluid, or both a gas and a fluid.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward," "horizontal," "vertical," and the like do not refer to absolute directions. Instead, these terms refer to directions relative to a nonspecific plane of reference. This non-specific plane of reference may be vertical, horizontal, or other angular orientation.

The singular forms "a", "an", and "the", include plural referents, unless the context clearly dictates otherwise. Within a claim, reference to an element in the singular is not intended to mean "one and only one" unless specifically so stated, but rather "one or more". Unless specifically stated otherwise, the term "some" refers to one or more.

Embodiments of the present disclosure may suitably "comprise", "consist", or "consist essentially of", the limiting features disclosed, and may be practiced in the absence of a limiting feature not disclosed. As used here and in the appended claims, the words "comprise", "has", and "include", and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

"Coupled" and "coupling" means that the subsequently described material is connected to previously described material. The connection may be a direct, or indirect connection, and may, or may not, include intermediary components such as plumbing, wiring, fasteners, mechanical power transmission, electrical communication, wired and/or wireless transmission, etc., which may suitable to affect operation of the components.

As used, the term "determining" encompasses a wide variety of actions. For example, "determining" may include calculating, computing, processing, deriving, investigating, looking up, for example, looking up in a table, a database, or another data structure, and ascertaining. In addition, "determining" may include receiving, for example, receiving information, and accessing, for example, accessing data in a memory. In addition, "determining" may include resolving, selecting, choosing, and establishing.

When the word "approximately" or "about" are used, this term may mean that there may be a variance in value of up to ±10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112(f), for any limitations of any of the claims, except for those in which the claim expressly uses the words 'means for' together with an associated function.

The following claims are not intended to be limited to the embodiments provided but rather are to be accorded the full scope consistent with the language of the claims.

What is claimed is:

1. An apparatus, comprising:

a processing chamber comprising a grounded chamber shield that at least partially defines a processing region;

an electrode disposed within the processing region of the processing chamber, the electrode including apertures extending through the electrode;

a voltage source configured to apply a positive DC bias to the electrode; and a grounded electrode shield disposed within the processing region and extending a distance from the electrode, wherein the distance is adjustable to vary a ratio of a surface area of the electrode to a surface area of the grounded electrode shield.

2. The apparatus of claim 1, wherein the grounded electrode shield is electrically coupled to the electrode.

3. The apparatus of claim 1, wherein the grounded electrode shield is electrically isolated from the electrode.

4. The apparatus of claim 1, wherein the distance is increased by adding a spacer between an electrically conductive portion of the grounded electrode shield and the electrode.

5. The apparatus of claim 4, wherein the spacer is a conductor that electrically couples the grounded electrode shield to the electrode.

6. The apparatus of claim 4, wherein the spacer is an insulator that electrically isolates the grounded electrode shield from the electrode.

7. The apparatus of claim 1, wherein the distance is decreased by removing a spacer between an electrically conductive portion of the grounded electrode shield and the electrode.

8. The apparatus of claim 1, wherein increasing the distance decreases the ratio of the surface area of the electrode to the surface area of the grounded electrode shield.

9. The apparatus of claim 1, further comprising spacers of the grounded electrode shield.

10. The apparatus of claim 9, wherein at least one of the spacers is a conductor.

11. The apparatus of claim 9, wherein at least one of the spacers is an insulator.

12. A method for biasing power in a chamber, comprising:

disposing an electrode within a processing chamber between a sputtering target and a substrate;

applying a positive DC bias to the electrode;

grounding a first electrical conductor disposed between the electrode and a second electrical conductor; and applying a negative DC bias to the second electrical conductor, wherein the second electrical conductor is disposed between the first electrical conductor and the substrate.

13. The method of claim 12, further comprising adjusting a ratio of a surface area of the electrode to a surface area of a grounded electrode shield.

14. The method of claim 13, further comprising decreasing the ratio of the surface area of the electrode to the surface area of the grounded electrode shield.

15. The method of claim 12, further comprising applying an additional positive DC bias to a third electrical conductor disposed between the electrode and the first electrical conductor.

16. The method of claim 15, wherein a first magnitude of the positive DC bias is greater than a second magnitude of the additional positive DC bias.

17. The method of claim 15, further comprising applying an additional negative DC bias to a fourth electrical conductor disposed between the first electrical conductor and the second electrical conductor.

18. The method of claim 12, further comprising applying an additional negative DC bias to a third electrical conductor disposed between the first electrical conductor and the second electrical conductor.

19. The method of claim 18, wherein a first magnitude of the negative DC bias is greater than a second magnitude of the additional negative DC bias.

20. The method of claim 12, wherein the electrode is configured to filter positively charged ions of a material included in the sputtering target and neutrals of the material towards the substrate.

* * * * *